(12) United States Patent
Shi et al.

(10) Patent No.: US 7,026,880 B2
(45) Date of Patent: Apr. 11, 2006

(54) QUADRATURE VCO USING SYMMETRICAL SPIRAL INDUCTORS AND DIFFERENTIAL VARACTORS

(75) Inventors: Bingxue Shi, Beijing (CN); Baoyong Chi, Beijing (CN)

(73) Assignee: Winbond Electronics Corp., Hsinchu (TW)

( * ) Notice: Subject to any disclaimer, the term of this patent is extended or adjusted under 35 U.S.C. 154(b) by 28 days.

(21) Appl. No.: 10/846,712

(22) Filed: May 13, 2004

(65) Prior Publication Data

US 2005/0253660 A1 Nov. 17, 2005

(51) Int. Cl.
*H03B 5/02* (2006.01)

(52) U.S. Cl. .......................................... 331/50; 331/46

(58) Field of Classification Search ................... 331/50, 331/46, 45
See application file for complete search history.

(56) References Cited

U.S. PATENT DOCUMENTS

| 5,489,878 A | * | 2/1996 | Gilbert ......................... 331/57 |
| 5,617,051 A | * | 4/1997 | Bingham ..................... 327/317 |
| 5,952,893 A | * | 9/1999 | Ghoshal .................. 331/108 C |
| 6,456,167 B1 | * | 9/2002 | Huang .......................... 331/46 |
| 2002/0039039 A1 | * | 4/2002 | Maligeorgos ............... 327/116 |

* cited by examiner

*Primary Examiner*—Joseph Chang
(74) *Attorney, Agent, or Firm*—J. C. Patents (57) ABSTRACT

A quadrature VCO includes two cross-coupled differential pairs, two parallel LC tank circuits, two LO units and a plurality of source followers, supplying by a tail current source and a tail capacitor. The LC tank circuit constitutes of symmetrical spiral inductors and differential varactors, which constitutes of common anode diodes. The quadrature VCO circuitry is implemented on a chip with 2.4 GHz operating frequency. The quadrature VCO generates quadrature LO signals with high phase accuracy and good gain match under low power, good phase noise and small chip area, thus it can be applied to a variety of integrated transceivers.

15 Claims, 6 Drawing Sheets

QUADRATURE VCO USING SYMMETRICAL SPIRAL INDUCTORS AND DIFFERENTIAL VARACTORS

BACKGROUND OF THE INVENTION

1. Field of Invention

The present invention relates to a quadrature voltage controlled oscillator (VCO), and more particularly, to a quadrature VCO circuitry with symmetrical spiral inductors and differential varactors implemented with complementary MOS in a system on chip.

2. Description of the Related Art

Voltage controlled oscillator (VCO) is widely used, for example in many transceivers incorporate quadrature downconverions mixers. Applications can include broadcast receivers such as radio and television, set top boxes for cable television, receivers in local area networks, test and measurement equipment, radar receivers, air traffic control receivers, and microwave communication links, etc. In the design of these transceiver systems, a major challenge is the generation of quadrature local oscillating (LO) signals.

Figure 1:
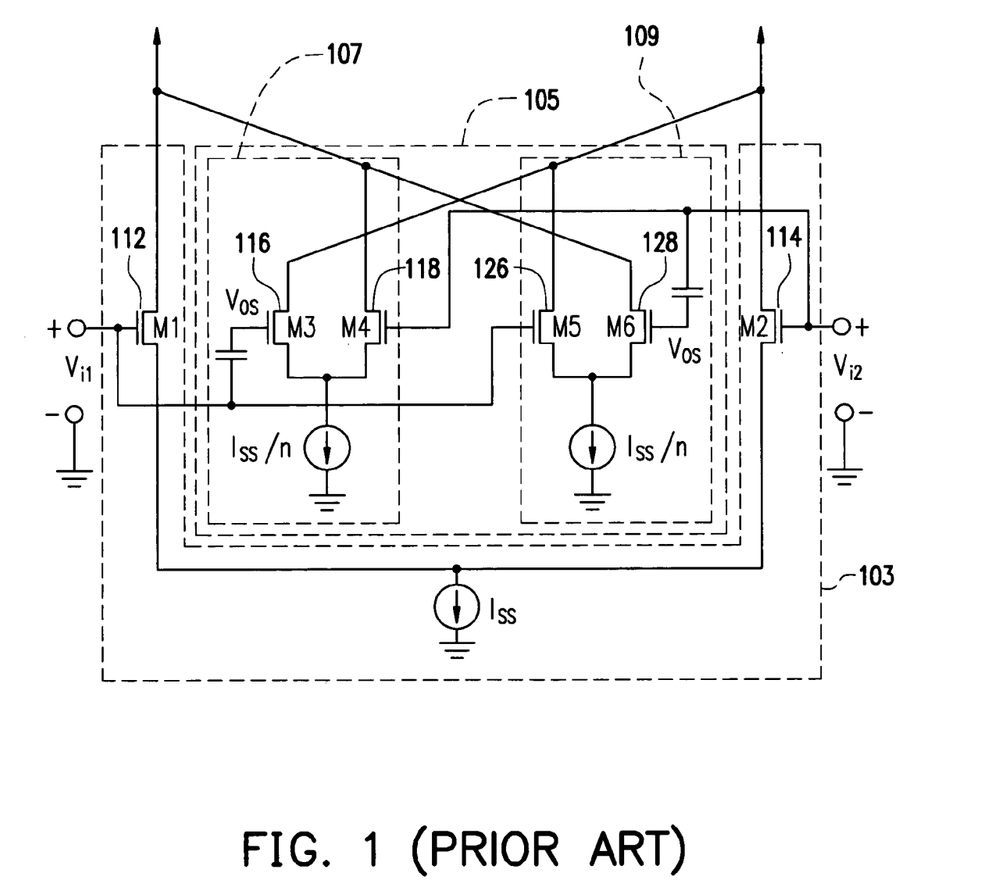
FIG. 1 is a schematic circuit diagram illustrating VCO according to prior art.

Referring to FIG. 1, a differential pair incorporating two auxiliary cross-coupled differential pairs in one of conventional arts is illustrated herein. The main differential pair 103 includes transistors 112 and 114. The gates of 112 and 114 are coupled to a differential input voltage $V_{i1}$ and $V_{i2}$. The sources of 112 and 114 are coupled to a current source. The sources of 112 and 114 are coupled to a 114. The gates of 112 and 114 are coupled to a differential input coupled to ground. Current source $I_{ss}$ is typically constructed as known to those skilled in the art. The drains of 112 and 114 supply currents $I_1$ and $I_2$ respectively. The drains of 112 and 114 are coupled to current outputs $I_1$ and $I_2$, respectively.

The first auxiliary differential pair 107 includes transistors 116 and 118. The gate of 116 is coupled to differential input voltage $V_{i1}$. The gate of 118 is coupled to differential input voltage $V_{i2}$. The sources of 116 and 118 are coupled together and then to a first terminal of a first current source $I_{ss}/n$. A second terminal of $I_{ss}/n$ is coupled to a ground potential. Current source $I_{ss}/n$ is typically constructed as a conventional current sources as is known to those skilled in the art. The drain of 116 is coupled to the drain of 114. The drain of 118 is coupled to the drain of 112.

The second auxiliary differential pair 109 includes transistors 126 and 128. The gate of 126 is coupled to differential input voltage $V_{i1}$. The gate of 128 is coupled to differential input voltage $V_{i2}$. The sources of 126 and 128 are tied together to a first terminal of a second current source $I_{ss}/n$. A second terminal of $I_{ss}/n$ is coupled to ground. The drain of 126 is coupled to the drain of 114. The drain of 128 is coupled to the drain of 112. From system point of view, quadrature LO signals are required to achieve high phase accuracy, good gain matching and low phase noise.

Figure 3A:
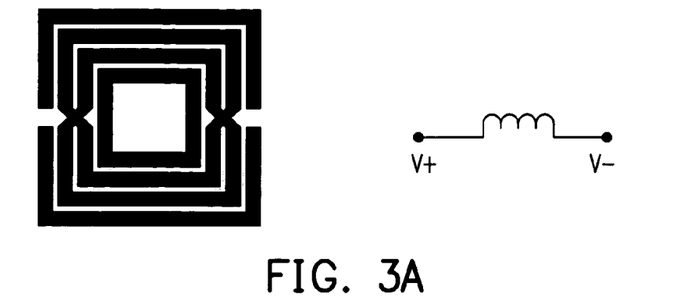
FIG. 3A is a schematic layout illustrating symmetrical spiral inductor according to an embodiment of the present invention.
Figure 3B:
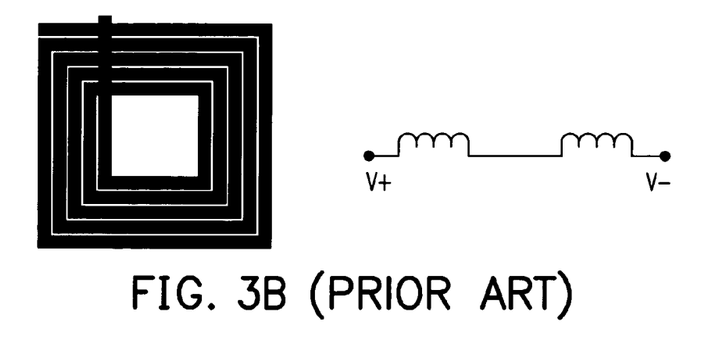
FIG. 3B is a schematic layout illustrating spiral inductor according to prior art.

Referring to FIG. 3B, it is a plan view of a multi-track spiral inductor suitable for integration onto an integrated circuit, such as one produced with a CMOS process. A square spiral inductor that is wound in two turns with several narrow tracks disposed in parallel upon a substrate. Equivalently any number of tracks may be used to achieve a multi-track design. A turn is counted each time the track is wound around in spiral such that a starting point is passed. Typically 5 to 20 turns are utilized in a spiral, with 3 to 10 producing optimum performance.

Figure 4A:
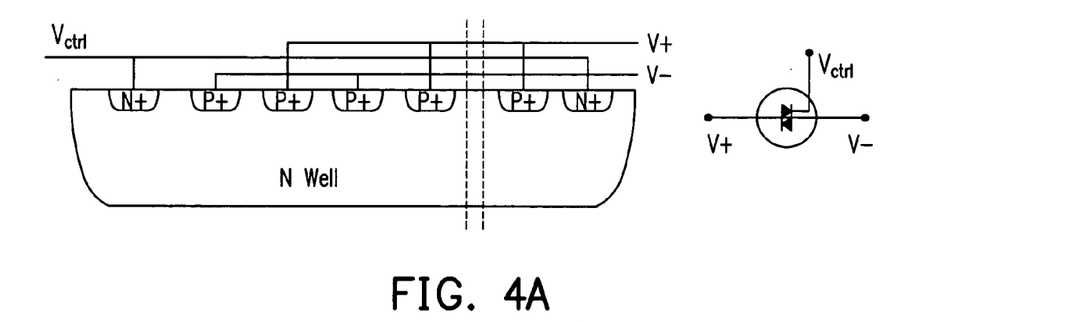
FIG. 4A is a cross-sectional diagram illustrating differential varactors according to an embodiment of the present invention.
Figure 4B:
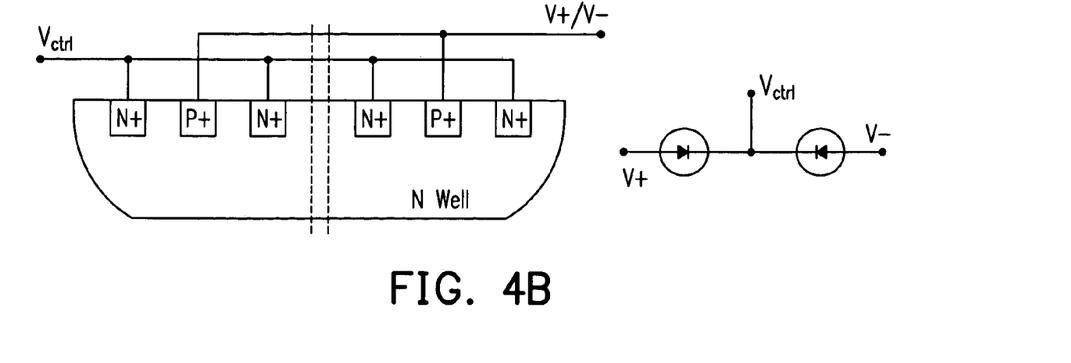
FIG. 4B is a cross-sectional diagram illustrating single-end varactors according to prior art.

Referring to FIG. 4B, a cross sectional view of a varactor is illustrated. A single-ended varactor is provided according to the connecting method shown therein, where control signal $V_{ctrl}$ is coupled to the $n^+$ diffusion area in the N-well, and the single-ended voltage V+/V− is read out from coupling to the $p^+$ diffusion area in the N-well. According to the arrangement and connection of the diffusion area in FIG. 4B, two reverse-biased diodes are common-anode coupled for forming a varactor.

In light of aforementioned technologies of prior art, a differential amplifying pair and a LC circuit consisted of symmetrical laid-out spiral inductors and differential varactors are desired, since differential structures improve the quality factor, and the symmetry of the circuit lowers flicker noise up-conversion. Moreover, a differential LC circuit reduces the chip area consumed thereby.

SUMMARY OF THE INVENTION

A quadrature voltage control oscillator (VCO) is provided, operating at 2.4 GHz frequency on a CMOS fabricated chip, for example, in this present invention. It combines a local oscillator (LO) and an oscillating means based on on-chip symmetrical spiral inductors and differential varactors, and a two-stage ring oscillator. With proper construction of the circuitry, a pair of output signals having quadrature phase difference is obtained. The construction of this VCO circuitry according to the present invention is described hereinafter.

The quadrature VCO of this present invention includes two pairs of cross-coupled differential pairs. Two LC tanks, playing as oscillating means, are coupled to the differential pairs in series correspondingly. And a two-stage ring oscillator is coupled to the two LC tanks in series in the quadrature VCO of the present invention. A tail current source, implemented with a p-MOSFET for example, and a tail capacitor are coupled in parallel and connected between a voltage source of the quadrature VCO and the differential pair. The tail capacitor is relatively large in capacitance, which provides a low impedance path to ac ground for higher harmonics, so it attenuates the high frequency noise component of the tail current source and improves the phase noise performance of the whole VCO. The cross-coupled differential pairs, implemented with p-type transistors, particularly p-MOSFETs for example, in positive feedback, feed the LC tanks to compensate the loss.

Their transconductance is engineered as follows:

$$g_m = 2G_m = 6/R_p = 6/\omega_o L Q_{tank} \tag{1}$$

where $G_m$ is the transconductance of the cross-coupled differential pairs, $R_p$ is a parallel resistance of the LC tanks at resonance, $\omega_o$ is the resonance frequency, L is the inductance of the LC tanks, $Q_{tank}$ is the quality factor of the LC tanks.

Wherein the LC tanks is based on on-chip symmetrical spiral inductors and differential varactors. In CMOS fabrication technology, for example, the inductor is mainly wound with the top metal layer, but the crossover sections include the next top metal layer over a substrate. On the other hand, the differential varactor is realized as reverse-biased differential diodes. The path to the small-signal ground can still be shorted if devices in the differential varactor with opposite polarity alternate for symmetry reason. These differential structures improve the tank's quality factor, and the symmetry of the circuit, all these will lower flicker noise up-conversion. Moreover, the differential LC tank reduces the chip area consumed by the LC tank since a LC tank in this present invention is only consisted of a symmetrical spiral inductor and a differential varactor.

The two-stage differential ring oscillator comprises n-MOSFETs, for example. The outputs of each stage are 90° out of phase. By combination of the ring oscillator and local oscillator, the low phase noise quadrature LO signals are obtained. The tail current source, which is also a constant current source, shared by the two sections, further enhance the accuracy of the quadrature VCO.

The circuitry of the quadrature VCO in the present invention further comprises four source followers, for driving the off-chip low impedance loads and for providing isolation if needed. The four source followers are coupled in parallel to the serially coupled aforementioned quadrature VCO circuitry. In one aspect of the present invention, the source followers can be omitted if the VCO is applied on a system on chip.

According to the circuitry in this present invention, a 2.4 GHz quadrature VCO with symmetrical spiral inductors and differential varactors is provided. It can generate quadrature LO signals with high phase accuracy and good gain matching under low power, good phase noise and small chip area, thus it can be applied to a variety of integrated transceivers.

DESCRIPTION OF THE EMBODIMENTS

Figure 2A:
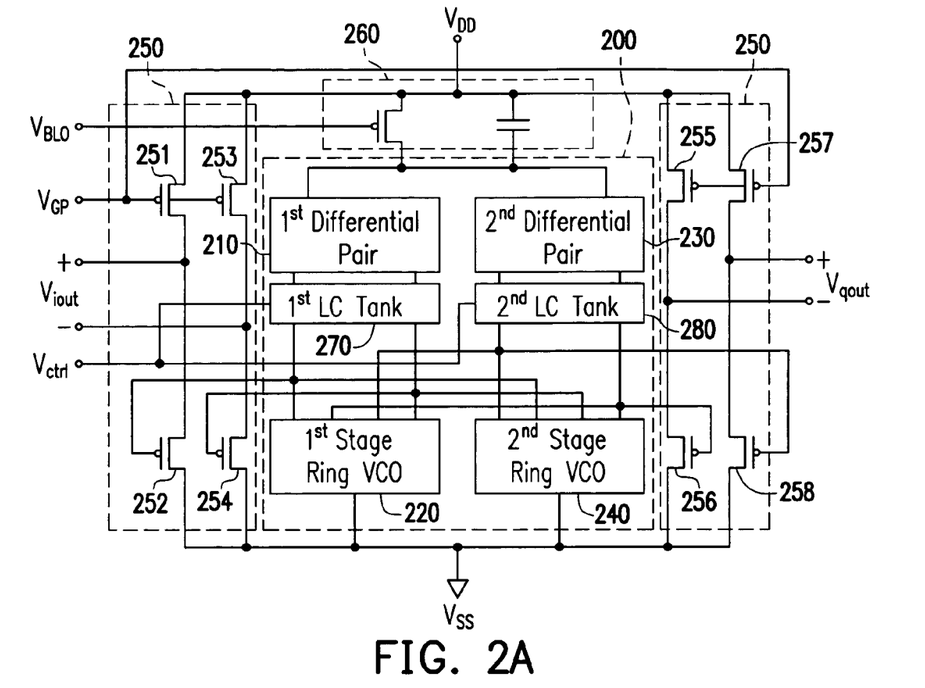
FIG. 2A is a schematic block diagram illustrating quadrature VCO according to an embodiment of the present invention.

Referring to FIG. 2A, a schematic block diagram of VCO circuitry according to an embodiment of the present invention is illustrated herein. The VCO circuitry includes an oscillating unit 200, a source unit 260, and a source follower unit 250. Wherein the oscillating units includes two identical sets of the following structure: a first differential pair 210 coupled to a first LC tank 270 and a first ring VCO 220 in series between power supply and ground in the circuitry of the present invention, and a second set of devices is coupled in an identical fashion as that of the first set of devices described above. The source unit 260 includes a tail current source 265 and a tail capacitor 262 coupled in parallel between the voltage supply VDD and a first node. The tail current source 265, controlled by a voltage level $V_{BLO}$, comprises a p-type transistor, a p-MOSFET for example. The tail capacitor 262 is relatively large in area for providing stable current source. Furthermore, the source follower unit 250 cross-coupled to the first and second stage ring oscillator 220 and 240 includes four sets of source followers, from which the VCO circuitry results $V_{IOUT}(+,)$ and $V_{QOUT}(+,)$ are differentially read out. The purpose of this source follower unit 250, controlled by a voltage level $V_{GP}$, is to drive the off-chip low impedance loads and to provide isolation. If the VCO circuitry in this present invention is applied on a system on chip, the source follower unit can be omitted.

Figure 2B:
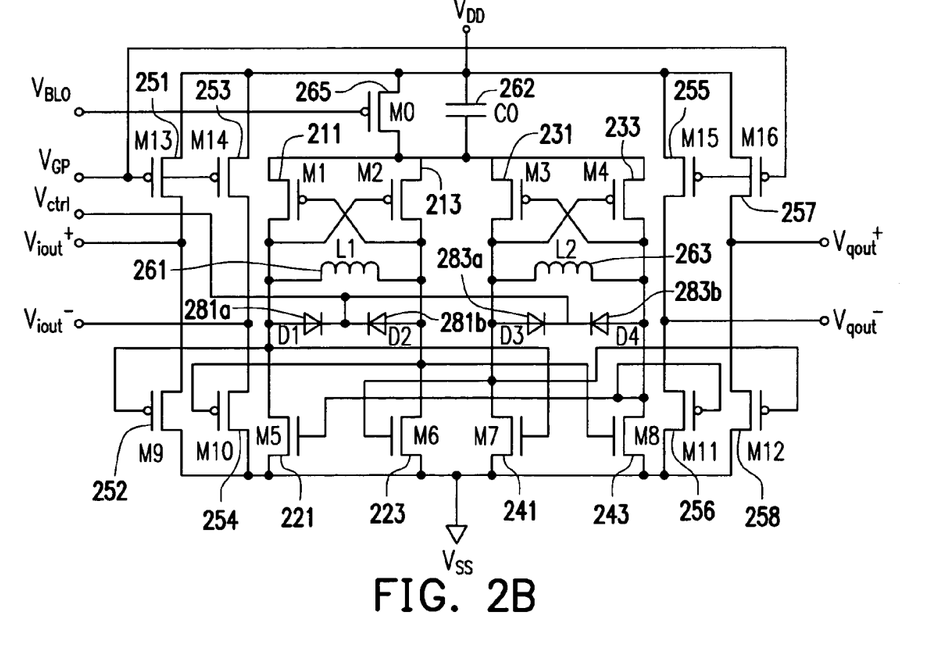
FIG. 2B is a schematic circuit diagram illustrating quadrature VCO according to an embodiment of the present invention.

Referring to FIG. 2B, an exemplary detailed circuitry of the FIG. 2A is embodied herein. In the differential pair 210 coupled to the source unit 260 via the first node in FIG. 2A, transistors 211 and 213 are cross-coupled via a second node and a third node, and are connected to the first LC tank 270 thereby. In the differential pair 230 coupled to the source unit 260 via the first node in FIG. 2A, transistors 231 and 233 are cross-coupled via a fourth and a fifth node, and are connected to the second LC tank 280 thereby. In the first LC tank 270, a spiral inductance 261 and a pair of reverse-biased diodes 281a and 281b are connected in parallel between the second node and the third node. In the second LC tank, a spiral inductance 263 and a pair of reverse-biased diodes 283a and 283b are connected in parallel between the fourth node and the fifth node. In the first ring oscillator 220 includes a pair of transistors 221 and 223 cross-coupled to a pair of transistors 241 and 243 in the second ring oscillator 240 via the fifth node, the fourth node, the second node, and the third node, respectively. That is, a gate of the transistor 221 is coupled to the fifth node, a gate of the transistor 223 is coupled to the fourth node, a gate of the transistor 241 is coupled to the second node, and a gate of the transistor 243 is coupled to the third node. Additionally, the transistors 221, 223, 241, and 243 are n-type transistors, for example.

Referring to FIG. 3A, a spiral layout on a metal layer on a substrate is illustrated herein. The inductor is mainly wound with the top metal layer, but the cross-sections include the next top metal layer. A symmetrical pattern is demonstrated. A four-track squared pattern is illustrated herein. Yet for those skilled in the art, neither the number of tracks of the pattern nor the shape of the pattern is restricted, any track number and shape of pattern that comply with symmetry requirement is within the scope of the present invention. For example, the shape of rectangle, hexagon, octagon, etc.

The LC tanks in the present invention are based on on-chip symmetrical spiral inductors and differential varactors. Referring to FIG. 4A, the differential varactor is realized as reverse-biased differential diodes its cross section are shown. The control port connects to the N-Well by only the left most $N_+$ diffusion and the right most $N_+$ diffusion (in ordinary single-ended diodes, the $N_+$ diffusion and $P_+$ diffusion interleave). The path to the small-signal ground can still be shorted if devices in the differential varactor with opposite polarity alternate for symmetry reason. These differential structures improve the tank's quality factor, and the symmetry of the circuit, all these will lower flicker noise up-conversion. Moreover, the differential LC tank reduces the chip area consumed by the LC tank almost 50%. (A LC tank only needs a symmetrical spiral inductor and a differential varactor).

The VCO circuitry in the present invention is simulated with HSPICE, using BSIM3.1 (Level 49) transistor models. The process provides 5 metal layers and 1 polysilicon layer. A CAD analysis and simulation tool of inductors, ASITIC, is used to optimize the inductors and to extract the parasitic component parameters. Each inductor is realized with an inductance 4.16 nH, a quality factor 6.539 and an area 0.24×0.24 mm². Each diode is modeled according to HSPICE Level 3 Diode model and a low series resistance. By layout strategy, the series resistance of each diode is lower to 0.52Ω. For the embodiments demonstrated hereinafter is based on the aforementioned simulation result.

Figure 5:
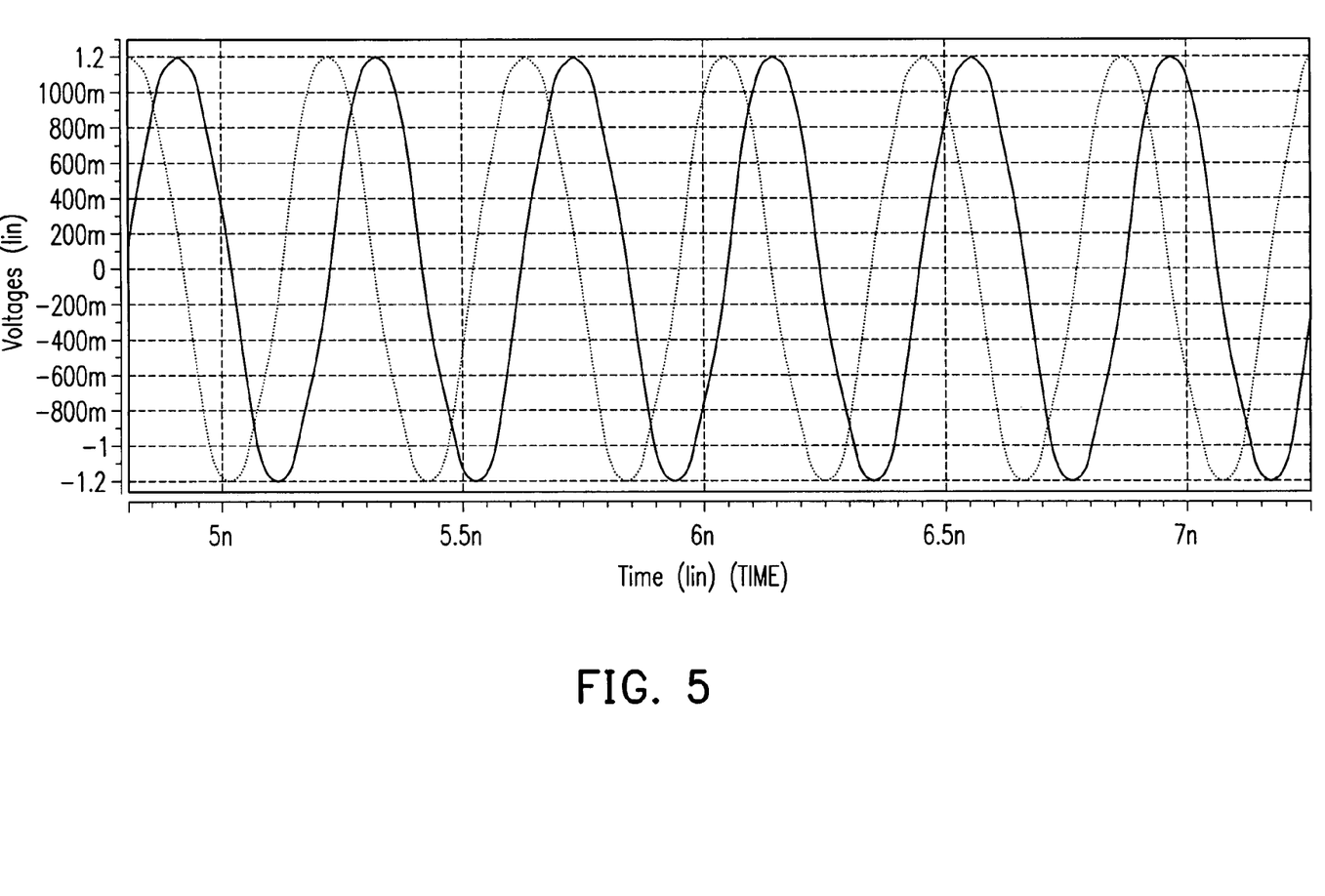
FIG. 5 is a transient diagram illustrating simulated waveforms of two quadrature outputs from the VCO core according to an embodiment of the present invention.

Referring to FIG. 5, a transient diagram of simulated waveforms of two quadrature outputs from VCO core, ($V_{1+}$–$V_{1-}$, $V_{Q+}$–$V_{Q-}$), is illustrated herein. According to the diagram, same frequency and differential peak-to-peak amplitude of 2.4V with a supply voltage 2.5V are inspected. The phase difference is 90°. Moreover, the VCO circuit in this present invention has good robustness on the variation of supply voltage. The center frequency variation is only 0.074 GHz in this embodiment, which is much smaller than the tuning range, when supply voltage is changed from about 2.2V to 2.8V.

The symmetrical spiral inductors in one embodiment of the present invention are fabricated and measurements are done. The measured inductance value is 3.96 nH and the series resistance is 6.49Ω at 1 MHz. Although the behavior in radio frequency range is differential from the one in low frequency, but this measurement result could be used as a basis to design the quadrature VCO.

Figure 6:
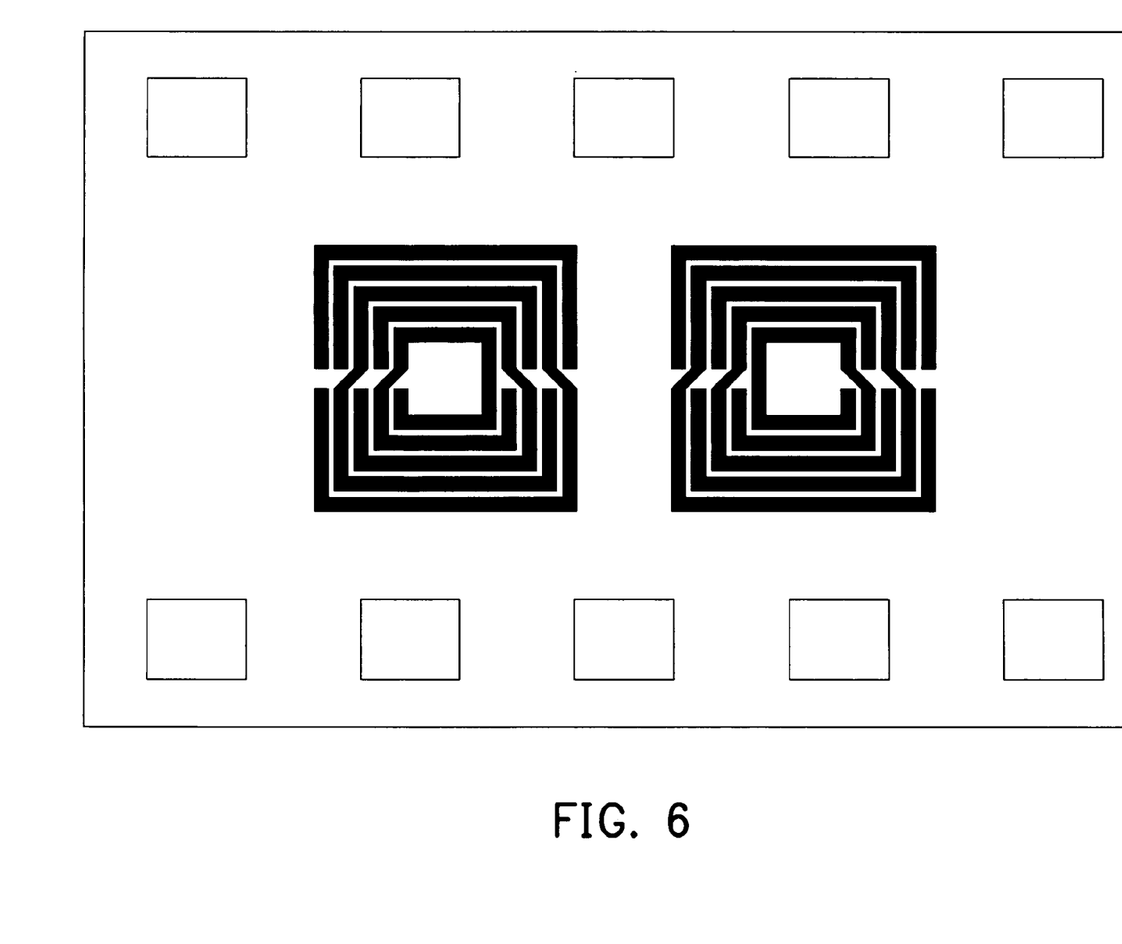
FIG. 6 is a microphotograph diagram illustrating fabricated VCO according to an embodiment of the present invention.

To verify the performance of the quadrature VCO, the circuit in one embodiment of the present invention is fabricated in 0.25 μm 2.5V CMOS digital process. FIG. 6 demonstrates the microphotograph of the fabricated VCO, where the die size is 0.83×0.68 mm². A significant portion of the die is occupied by the pads and two inductors since the core circuit area is only 0.62×0.41 mm².

Figure 7:
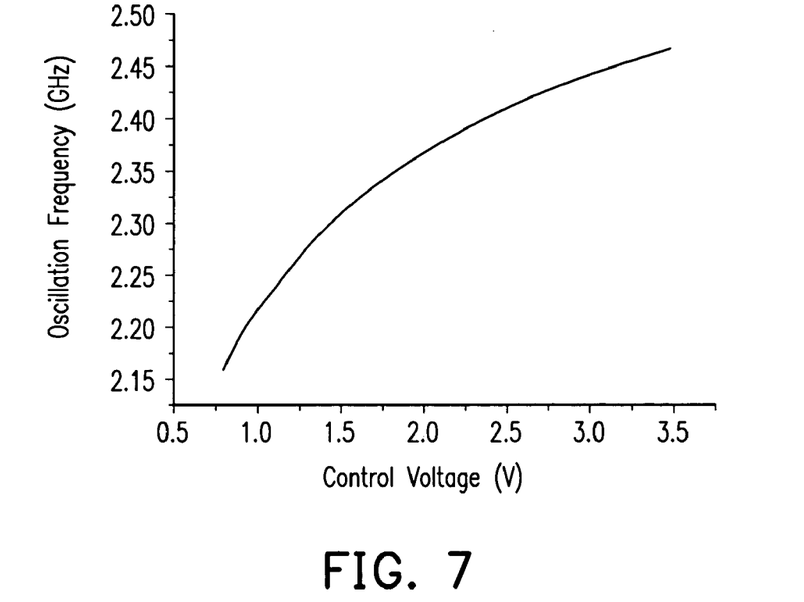
FIG. 7 is a diagram illustrating experimentally measured VCO transfer function according to an embodiment of the present invention.

Referring to FIG. 7, an experimentally measured VCO transfer function is shown according to one embodiment of the present invention. When the control voltage changes from about 0.8V to about 3.5V, the oscillation frequency changes from about 2.160 GHz to about 2.465 GHz. Therefore, more than 300 MHz tuning range can be provided. This is a substantially wide frequency range and can satisfy a variety of applications in the field.

Figure 8:
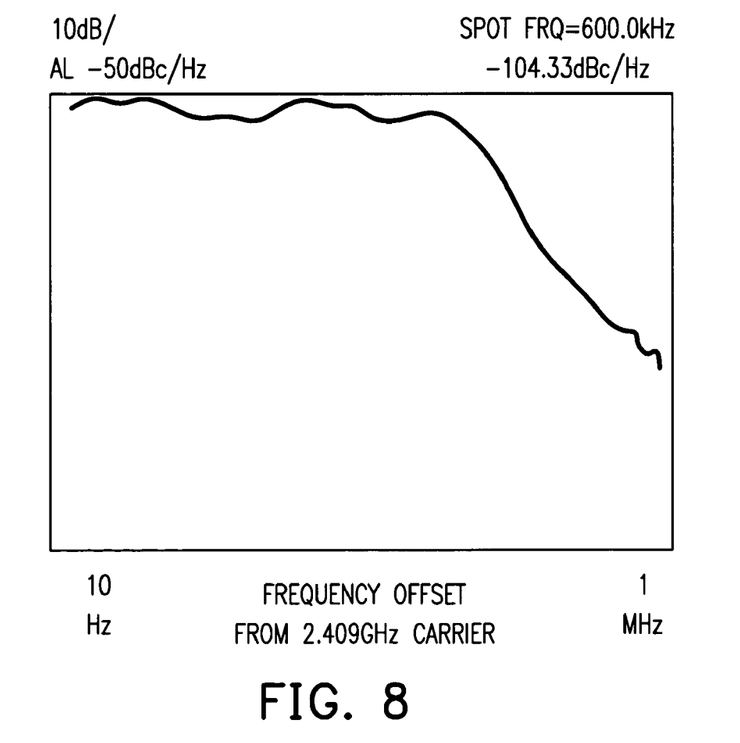
FIG. 8 is a diagram illustrating measured phase noise performance on one port of differential outputs according to an embodiment of the present invention.

Referring to FIG. 8, the phase noise is –104.33 dBc/Hz at 600 kHz offset @2.41 GHz as shown. The measurement is done on one port of the differential outputs to reduce package pins. If differential outputs are drawn out, the measured phase noise will be more than 6 dBc. This coupled be explain as follows: when the measurements are done on the differential output, the oscillation amplitude will be about 2 times larger. According to formula (2) as shown below, the phase noise would be 6 dBc or better, and differential outputs could reduce common-mode noise, so the phase noise could be more than –110.33 dBc/Hz at 600 kHz offset @2.41 GHz and better if the different outputs are utilized. This result is very similar to that of simulation.

$$\zeta\{f_{off}\} = \frac{1}{8\pi^2 f_{off}^2} \frac{L_{tank}^2 \omega^4}{V_{SW}^2} \sum_n \left( \frac{\overline{i_n^2}}{\Delta f} \cdot \Gamma_{rms,n}^2 \right) \quad (2)$$

One embodiment of prototype circuit of the present invention is fabricated in 0.25 μm CMOS digital process. The measure results show that the proposed VCO could generate quadrature LO signals with a tuning range of more than 300 MHz and phase noise –104.33 dBc/Hz at 600 kHz offset @2.41 GHz (when only one port of differential outputs is measured). It consumes 52.5 mW when VDD=2.5V (including 20 mW output buffers). Thus each LC-VCO only consumes less than 26.3 mW (including two buffers), which is very power efficient. Die area is only 0.83×0.68 mm². This VCO could be used in a variety of integrated wireless transceivers.

Although the invention has been described with reference to a particular embodiment thereof, it will be apparent to those skilled in the art that modifications to the described embodiment may be made without departing from the spirit of the invention. Accordingly, the scope of the invention will be defined by the attached claims and not by the above detailed description.

What is claimed is:

1. A quadrature voltage control oscillator (VCO), comprising:
   a current source, controlled by a first voltage level, for providing a constant current;
   a capacitor, coupled to the current source in parallel between a voltage supply and a first node;
   a first tank circuit, having a first inductor and a first varactor coupled in parallel between a second node and a third node, controlled by a second voltage level;
   a second tank circuit, having a second inductor and a second varactor coupled in parallel between a fourth node and a fifth node, controlled by the second voltage level;
   a first differential pair, coupled between the current source and the first tank circuit, wherein the first differential pair is coupled to the current source in series via the first node and is coupled to the first tank circuit in parallel via the second node and the third node;
   a second differential pair, coupled between the current source and the second tank circuit, wherein the second differential pair is coupled to the current source in series via the first node is coupled to the second tank circuit in parallel via the fourth node and the fifth node;
   a first ring oscillator, coupled to the first tank circuit in parallel via the second node and the third node, and coupled between the first differential pair and a ground voltage level in series;
   a second ring oscillator, coupled to the second tank circuit in parallel via the fourth node and the fifth node, and coupled between the second differential pair and the ground voltage level in series;
   a first source follower, associated with the second node;
   a second source follower, associated with the third node;
   a fourth source follower, associated with the fourth node; and
   a fourth source follower, associated with the fifth node, wherein a positive first output voltage of the first source follower and a negative first output voltage of the second source follower form a first output voltage level, and a positive second output voltage of the third source follower and a negative second output voltage of the fourth source follower form a second output voltage level differed from the first output voltage level by quadrature phase.

2. The quadrature VCO as recited in claim 1, wherein the first inductor and the second inductor are wound with a top metal layer over a substrate, and the crossover sections use a next top metal layer respectively.

3. The quadrature VCO as recited in claim 1, wherein the first varactor and the second varactor are coupled in differentiated fashion respectively.

4. The quadrature VCO as recited in claim 1, wherein the first varactor and the second varactor are coupled in single-ended fashion respectively.

5. The quadrature VCO as recited in claim 1, wherein the first differential pair comprises:
    a first transistor having a gate coupled to the third node, a source coupled to the first node and a drain coupled to the second node; and
    a second transistor, having a gate coupled to the second node, a source coupled to the first node and a drain coupled to the third node.

6. The quadrature VCO as recited in claim 1, wherein the second differential pair comprises:
    a third transistor having a gate coupled to the fifth node, a source coupled to the first node and a drain coupled to the fourth node; and
    a fourth transistor, having a gate coupled to the fourth node, a source coupled to the first node and a drain coupled to the fifth node.

7. The quadrature VCO as recited in claim 1, wherein the first transistor, the second transistor, the third transistor and the fourth transistor comprise p-type transistors.

8. The quadrature VCO as recited in claim 7, wherein the p-type transistors comprise p-MOSFETs.

9. The quadrature VCO as recited in claim 1, wherein the first inductor and the second inductor comprise a symmetrical spiral inductor being laid out based on a symmetrical pattern respectively.

10. The quadrature VCO as recited in claim 9, wherein the symmetrical pattern comprises one from a group of square, hexagon, and octagon.

11. The quadrature VCO as recited in claim 1, wherein the varactor comprises two reverse-biased differential diodes coupled to a common anode where the common anode is coupled to the second voltage level.

12. The quadrature VCO as recited in claim 1, wherein the first ring oscillator comprises:
    a fifth transistor, having a gate coupled to the fifth node, a drain coupled to the second node, and a source coupled to the ground voltage level; and
    a sixth transistor, having a gate coupled to the fourth node, a drain coupled to the third node, a source coupled to the ground voltage level.

13. The quadrature VCO as recited in claim 12, wherein the second ring oscillator comprises:
    a seventh transistor, having a gate coupled to the second node, a drain coupled to the fourth node, and a source coupled to the ground voltage level; and
    an eighth transistor, having a gate coupled to the third node, a drain coupled to the fifth node, and a source coupled to the ground voltage level.

14. The quadrature VCO as recited in claim 13, wherein the fifth transistor, the sixth transistor, the seventh transistor and the eight transistor are n-type transistors.

15. The quadrature VCO as recited in claim 1, wherein the first source follower comprises:
    a ninth transistor, having a gate coupled to the third node, a drain coupled to the ground voltage level, and a source, and
    a thirteenth transistor, having a gate coupled to a third voltage level, a drain coupled to the source of the ninth transistor from where the positive first output voltage level is read, and a source coupled to the voltage supply;
the second source follower comprises:
    a tenth transistor, having a gate coupled to the fourth node, a drain coupled to the ground voltage level, and a source, and
    a fourteenth transistor, having a gate coupled to the third voltage level, a drain coupled to the source of the tenth transistor from where the negative first output voltage level is read, and a source coupled to the voltage supply;
the third source follower comprises:
    a twelfth transistor, having a gate coupled to the fourth node, a drain coupled to the ground voltage level, and a source, and
    a sixteenth transistor, having a gate coupled to the third voltage level, a drain coupled to the source of the twelfth transistor from where the positive second output voltage level is read, and a source coupled to the voltage supply; and
the fourth source follower comprises:
    an eleventh transistor, having a gate coupled to the fifth node, a drain coupled to the ground voltage level, and a source, and
    a fifteenth transistor, having a gate coupled to the third voltage level, a drain coupled to the source of the eleventh transistor from where the negative second output voltage level is read, and a source coupled to the voltage supply.

* * * * *